(12) United States Patent
Basit et al.

(10) Patent No.: US 12,213,258 B2
(45) Date of Patent: Jan. 28, 2025

(54) METHOD OF MANUFACTURE FOR EMBEDDED IC CHIP DIRECTLY CONNECTED TO PCB

(71) Applicant: AVERATEK CORPORATION, Santa Clara, CA (US)

(72) Inventors: Haris Basit, San Jose, CA (US); Michael Riley Vinson, Sunnyvale, CA (US); Shinichi Iketani, Sunnyvale, CA (US)

(73) Assignee: Averatek Corporation, Santa Clara, CA (US)

( * ) Notice: Subject to any disclaimer, the term of this patent is extended or adjusted under 35 U.S.C. 154(b) by 733 days.

(21) Appl. No.: 16/654,637

(22) Filed: Oct. 16, 2019

(65) Prior Publication Data

US 2020/0120811 A1    Apr. 16, 2020

Related U.S. Application Data

(60) Provisional application No. 62/746,189, filed on Oct. 16, 2018.

(51) Int. Cl.
*H05K 3/42* (2006.01)
*H05K 1/02* (2006.01)
(Continued)

(52) U.S. Cl.
CPC ............ *H05K 3/306* (2013.01); *H05K 1/023* (2013.01); *H05K 3/04* (2013.01); *H05K 3/425* (2013.01);
(Continued)

(58) Field of Classification Search
CPC ........ H05K 3/423; H05K 3/425; H05K 3/465; H05K 3/4644; H05K 3/4661; H05K 3/467;
(Continued)

(56) References Cited

U.S. PATENT DOCUMENTS 5,969,422 A * 10/1999 Ting ................. H01L 21/76843
257/769
6,245,594 B1 * 6/2001 Wu ......................... H01L 24/81
257/E21.511
(Continued)

FOREIGN PATENT DOCUMENTS

| EP | 1622435 | | 2/2006 |
|----|---------|---|--------|
| JP | 2006283165 A | * | 10/2006 |
| WO | 2018140517 | | 8/2018 |

OTHER PUBLICATIONS

Liu et al, "A potential silver catalyst system for new generation of electroless Cu process as a palladium substitution," 2016 11th International Microsystems, Packaging, Assembly and Circuits Technology Conference (IMPACT), 2016, pp. 77-80. (Year: 2016).*

(Continued)

*Primary Examiner* — A. Dexter Tugbang
(74) *Attorney, Agent, or Firm* — Fish IP Law, LLP

(57) ABSTRACT

Devices and methods for forming an electrical circuit out of a conductor embedded in two layers of substrate are disclosed. Portions of the two layers of substrate and the conductor are removed, forming a cavity through the two layers and the conductor. A blocker material is deposited along the wall of the cavity. A portion of the blocker material and adjacent layer of the substrate is removed forming another cavity in contact with a part of the conductor. A surface of the second cavity is then electroless plated by a conductive metal to form part of the electrical circuit.

11 Claims, 7 Drawing Sheets

(51) Int. Cl.
*H05K 3/04* (2006.01)
*H05K 3/30* (2006.01)
*H05K 3/46* (2006.01)
*H01L 21/768* (2006.01)

(52) U.S. Cl.
CPC ........ *H05K 3/465* (2013.01); *H01L 21/76831* (2013.01); *H01L 21/76843* (2013.01); *H05K 3/422* (2013.01); *H05K 3/423* (2013.01); *H05K 3/429* (2013.01); *H05K 3/467* (2013.01); *Y10T 29/49165* (2015.01)

(58) Field of Classification Search
CPC ... H05K 2203/0716; H05K 2201/0236; H05K 3/422; H05K 3/429; H05K 3/184; H05K 3/185; H05K 1/023; H05K 3/04; H05K 3/306; Y10T 29/49165; H01L 21/76831; H01L 21/76843; H01L 21/4857; H01L 24/03; H01L 24/11
See application file for complete search history.

(56) References Cited

U.S. PATENT DOCUMENTS

| | | | | |
|---|---|---|---|---|
| 6,265,075 | B1* | 7/2001 | Klueppel | H05K 3/184 |
| | | | | 428/209 |
| 6,352,917 | B1* | 3/2002 | Gupta | H01L 21/76831 |
| | | | | 257/E21.585 |
| 2006/0191711 | A1 | 8/2006 | Cho | |
| 2008/0087986 | A1 | 4/2008 | Tanikella | |
| 2011/0115071 | A1 | 5/2011 | Smeys | |
| 2012/0129297 | A1 | 5/2012 | Kang | |
| 2012/0182651 | A1* | 7/2012 | Dungan | H01L 24/11 |
| | | | | 257/773 |
| 2012/0234584 | A1* | 9/2012 | Ejiri | H01L 21/4857 |
| | | | | 216/13 |
| 2018/0098428 | A1 | 4/2018 | Hua | |

OTHER PUBLICATIONS

International search report dated Feb. 5, 2020, for related PCT application No. PCT/US2019/056548. 5 Pages.

* cited by examiner

METHOD OF MANUFACTURE FOR EMBEDDED IC CHIP DIRECTLY CONNECTED TO PCB

This application claims the benefit of U.S. Provisional Patent No. 62/746,189, filed Oct. 16, 2018, which is incorporated by reference in its entirety herein.

FIELD OF THE INVENTION

The field of the invention relates to methods and systems for making electrical circuits.

BACKGROUND

The following description includes information that may be useful in understanding the present invention. It is not an admission that any of the information provided herein is prior art or relevant to the presently claimed invention, or that any publication specifically or implicitly referenced is prior art.

The manufacture of electrical circuits (e.g., printed circuit board, etc) is a highly competitive field with constant innovation. For example, WO 2018/140517 to Kozlovski teaches forming a substrate having cavities, placing an integrated circuit (IC) and other components in the cavities, forming a conductive pattern to interconnect the IC and components, and covering the components and conductive pattern in dielectric layer. However, Kozlovski does not teach not teach embedding an IC in substrate (e.g., photo-imageable dielectric material (PID)) and making a hole or via in the substrate to connect the IC (e.g., I/O port) to an electrical circuit and plating a conductor to form the circuit.

EP 1622435 to Baron, et al, teaches making recesses for components or ICs in a substrate or dielectric material and trenches or via holes, inserting the components or IC in the recesses, and encapsulating the components in the recesses with dielectric material. Conductors are then plated to the trench or via holes. However, Baron does not teach embedding an IC without a conductor patter, and does not teach the combination of using PID and photoablation to form patterns of catalyst that make up an electrical circuit, and plating a conductor to the catalyst to form the electrical circuit connected to the IC or electrical component.

All publications identified herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

Thus, there is still a need for improved methods and systems for manufacturing a portion of an electrical circuit having an electrical component.

SUMMARY OF THE INVENTION

The inventive subject matter provides apparatus, systems, and methods for manufacturing portions of a circuit. A first layer of dielectric material, preferably photoimageable, is deposited over a substrate, and a first cavity is formed in the first layer of dielectric material. An electrical component is deposited in the first cavity, and a second layer of dielectric material (e.g., photoimageable) is deposited over the electrical component, preferably embedding the electrical component in the dielectric material. A second cavity is formed in the second layer of dielectric material, and a catalyst (e.g., Pt, Pd, Ag, Au, Cu, Ni, Co, Rh, In, Sn, alloys or combinations thereof, etc) is deposited over the second layer of dielectric material, preferably such that a portion of the catalyst contacts at least a portion of the electrical component. The catalyst is deposited in a layer (optionally continuous layer) that is no more than 50 nm thick, preferably no more than 25 nm thick, more preferably no more than 10 nm thick. A conductor (e.g., Cu, alloys, etc) is deposited (e.g., electroless, electrolytic, etc) over an exposed portion of the catalyst, forming a portion of the circuit. In preferred embodiments, the conductor is in direct contact with the electrical component, for example an I/O port of the component. Depositing or plating the conductor can be optionally accelerated by electrolytic plating.

It is contemplated that methods of the inventive subject matter can be used to form parts of circuits with multiple electrical components embedded in dielectric material, whether in the same layer (e.g., first and second electrical components embedded in first layer of dielectric material), in adjacent layers (e.g., first electrical component in first layer, second electrical component in second layer, etc), or in separate non-adjacent layers (e.g., first electrical component in first dielectric material layer, second electrical component in third dielectric material layer, and second layer of dielectric material layer between first and second layers).

In some embodiments, a portion of a circuit is manufactured by depositing a first catalyst on an electrical component, forming a first layer of dielectric material over a portion of the first catalyst, and depositing a first conductor over an exposed portion of the first catalyst. A second catalyst is deposited over the first layer of dielectric material, such that a portion of the second catalyst contacts the first conductor, and a second conductor is deposited over an exposed portion of the second catalyst. A portion of the first layer of dielectric material can be removed to form the exposed portion of the first catalyst (e.g. circuit pattern, etc). A second layer of dielectric material can also be deposited over the second catalyst, and a portion of the second layer of the dielectric material removed, such that the exposed portion of the second catalyst is formed.

Further methods for manufacturing a portion of a circuit are contemplated, such as depositing a first layer of dielectric material over a substrate, forming a first cavity in the first layer of dielectric material, and depositing an electrical component in the first cavity. A catalyst is deposited over at least a portion of the electrical component and the first layer of dielectric material, and a conductor is deposited over an exposed portion of the catalyst. A second layer of dielectric material can also be deposited over the electrical component and a portion of the second layer of dielectric material is removed to form the exposed portion of the catalyst. The conductor is preferably in direct contact with the electrical component, more preferably in direct contact with an I/O port of the electrical component.

It is also contemplated to manufacture a portion of a circuit by depositing a first layer of dielectric material over an electrical component, forming a first cavity in the first layer of dielectric material, and depositing a catalyst on the first layer of dielectric material, such that a portion of catalyst contacts a portion of the electrical component. A conductor also is deposited (e.g., electroless plated) over an exposed portion of the catalyst. The exposed portion of the catalyst can be formed by depositing a second layer of dielectric material over the catalyst and removing a portion of the second layer of dielectric material. The conductor is preferably in direct contact with the electrical component, more preferably an I/O port of the electrical component.

Various objects, features, aspects and advantages of the inventive subject matter will become more apparent from the following detailed description of preferred embodiments, along with the accompanying drawing figures in which like numerals represent like components.

DETAILED DESCRIPTION

Figure 1A:
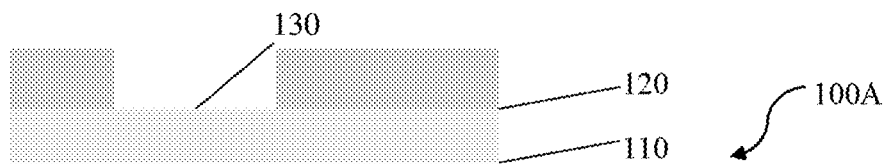
FIGS. 1A-1F depict steps in a process of the inventive subject matter.

The inventive subject matter provides apparatus, systems, and methods for manufacturing portions of a circuit. A first layer of dielectric material, preferably photoimageable, is deposited over a substrate, and a first cavity is formed in the first layer of dielectric material. An electrical component is deposited in the first cavity, and a second layer of dielectric material (e.g., photoimageable) is deposited over the electrical component, preferably embedding the electrical component in the dielectric material. A second cavity is formed in the second layer of dielectric material, and a catalyst (e.g., Pt, Pd, Ag, Au, Cu, Ni, Co, Rh, In, Sn, alloys or combinations thereof, etc) is deposited over the second layer of dielectric material, preferably such that a portion of the catalyst contacts at least a portion of the electrical component. The catalyst is deposited in a layer (optionally continuous layer) that is no more than 50 nm thick, preferably no more than 25 nm thick, more preferably no more than 10 nm thick. A conductor (e.g., Cu, alloys, etc) is deposited (e.g., electroless, electrolytic, etc) over an exposed portion of the catalyst, forming a portion of the circuit. In preferred embodiments, the conductor is in direct contact with the electrical component, for example an I/O port of the component. Depositing or plating the conductor can be optionally accelerated by electrolytic plating.

In some embodiments, a third layer of dielectric material (e.g., photoimageable) is deposited over the catalyst and a portion of the third layer of dielectric material is removed to form the exposed portion of the catalyst. Viewed from another perspective, the pattern for the circuit is created by removing parts of the third layer of dielectric material to expose catalyst in the shape of the circuit pattern. The second cavity (e.g., circuit pattern) preferably exposes at least a portion of the electrical component, for example an I/O port of the electrical component.

The cavity, whether first cavity, second cavity, or both, is preferably made by one of mechanical ablation, thermal ablation, or photolithography, but can also be formed by any appropriate methods or techniques. The electrical component is one of an integrated circuit, a resistor, a capacitor, an inductor, or a surface mount component, but combinations thereof or additional components are contemplated.

It is contemplated that the first layer of dielectric material has approximately the same thickness as the electrical component, for example 100 µm, 75 µm, 50 µm, 25 µm, 10 µm, or 5 µm or less. However, layers of dielectric material that do not contain an electrical component (e.g., layers containing via, through hole, conductor, etc) are typically less thick, for example as thin as 2 µm or 1 µm.

In some embodiments, a plating resist layer is deposited over a portion of the catalyst to form the exposed portion of the catalyst. Viewed from another perspective, the plating resist layer covers portions of the catalyst while leaving exposed portions of the catalyst available for plating (e.g., electroless plating) a conductor. The conductor (and optionally the plating resist layer) is ground (e.g., mechanically ground) approximately flush to the second layer of dielectric material. A second catalyst is deposited over the second layer of dielectric material and the conductor, and a second conductor is deposited (e.g., electroless plated) over an exposed portion of the second catalyst. The exposed portion of the second catalyst is typically formed by depositing a third layer of dielectric material over the second layer of catalyst and removing a portion of the third layer of dielectric material to expose portions of the second catalyst. Viewed from another perspective, the circuit pattern is etched out of the third layer of dielectric material to expose catalyst in the shape of the pattern.

It is contemplated that methods of the inventive subject matter can be used to form parts of circuits with multiple electrical components embedded in dielectric material, whether in the same layer (e.g., first and second electrical components embedded in first layer of dielectric material), in adjacent layers (e.g., first electrical component in first layer, second electrical component in second layer, etc), or in separate non-adjacent layers (e.g., first electrical component in first dielectric material layer, second electrical component in third dielectric material layer, and second layer of dielectric material layer between first and second layers).

For example, a third cavity is formed in the first layer of dielectric material, a second electrical component is deposited in the third cavity, and the second layer of dielectric material is deposited over the second electrical component. A fourth cavity is formed in the second layer of dielectric material and the catalyst is deposited such that a second portion of the catalyst contacts a portion of the second electrical component. The conductor is deposited over a second exposed portion of the catalyst (e.g., circuit pattern). A third layer of dielectric material can be further deposited over the catalyst, and a portion of the third layer of dielectric material is removed to form the exposed portion of the catalyst and the second exposed portion of the catalyst. In preferred embodiments, the conductor is in direct contact with the both electrical components, more preferably an I/O port.

In some embodiments, a third cavity is formed in the second layer of dielectric material, a second electrical component is deposited in the third cavity, and the catalyst is deposited such that a second portion of the catalyst contacts a portion of the second electrical component. The conductor is deposited (e.g., electroless plated) over a second exposed portion of the catalyst. The exposed portions of the catalyst can be formed by depositing a third layer of dielectric material over the catalyst and removing a portion of the third layer of dielectric material, thereby forming the exposed portions of catalyst. The conductor is preferably in direct contact with both electrical components, more preferably an I/O port of each component.

Similarly, a portion of the third layer of dielectric material is removed to form a third cavity, a second electrical component is deposited in the third cavity, a fourth layer of dielectric material is deposited over the conductor and the second electrical component. A portion of the fourth layer of dielectric material is further removed, and a second catalyst is deposited over the fourth layer of dielectric material, such that the second catalyst contacts a portion of the conductor and a portion of the second electrical component. A second conductor is deposited over an exposed portion of the second catalyst. The exposed portion of the second catalyst can be formed by depositing a fifth layer of dielectric material over the second catalyst, and a portion of the fifth layer of dielectric material is removed to form the exposed portions.

In some embodiments, a portion of a circuit is manufactured by depositing a first catalyst on an electrical component, forming a first layer of dielectric material over a portion of the first catalyst, and depositing a first conductor over an exposed portion of the first catalyst. A second catalyst is deposited over the first layer of dielectric material, such that a portion of the second catalyst contacts the first conductor, and a second conductor is deposited over an exposed portion of the second catalyst. A portion of the first layer of dielectric material can be removed to form the exposed portion of the first catalyst (e.g. circuit pattern, etc). A second layer of dielectric material can also be deposited over the second catalyst, and a portion of the second layer of the dielectric material removed, such that the exposed portion of the second catalyst is formed.

Further methods for manufacturing a portion of a circuit are contemplated, such as depositing a first layer of dielectric material over a substrate, forming a first cavity in the first layer of dielectric material, and depositing an electrical component in the first cavity. A catalyst is deposited over at least a portion of the electrical component and the first layer of dielectric material, and a conductor is deposited over an exposed portion of the catalyst. A second layer of dielectric material can also be deposited over the electrical component and a portion of the second layer of dielectric material is removed to form the exposed portion of the catalyst. The conductor is preferably in direct contact with the electrical component, more preferably in direct contact with an I/O port of the electrical component.

It is also contemplated to manufacture a portion of a circuit by depositing a first layer of dielectric material over an electrical component, forming a first cavity in the first layer of dielectric material, and depositing a catalyst on the first layer of dielectric material, such that a portion of catalyst contacts a portion of the electrical component. A conductor also is deposited (e.g., electroless plated) over an exposed portion of the catalyst. The exposed portion of the catalyst can be formed by depositing a second layer of dielectric material over the catalyst and removing a portion of the second layer of dielectric material. The conductor is preferably in direct contact with the electrical component, more preferably an I/O port of the electrical component.

It is also contemplated that the methods described be applied to the reverse side of the electrical component. For example, a portion of the substrate on which the electrical component rests can be removed to expose additional ports on bottom of the electrical component. A pattern of catalyst can be formed as described, and a conductor plated to form an additional portion of an electrical circuit. Likewise, where the electrical component rests on a layer of dielectric material (e.g., photoimageable), portions of the dielectric layer can be removed and a pattern of catalyst formed to plate a conductor, forming an additional electrical circuit.

The present invention relates to methods, systems and devices for manufacturing a portion of an electrical circuit having an electrical component.

FIGS. 1A through 1F depict steps for manufacturing a portion of an electrical circuit having an electrical component. FIG. 1A depicts assembly 100A with dielectric layer 120 on substrate 110, with cavity 130 in dielectric layer 120. It is contemplated that assembly 100 is assembled before manufacture of the electrical circuit. However, in preferred embodiments assembly 100 is formed by depositing dielectric layer 120 on substrate 110, and removing a portion of dielectric layer 120 to form cavity 130. Cavity 130 is preferably formed by photo ablation of dielectric material 120, which is preferably photoimageable (PID). However, alternative techniques, such as thermal ablation or milling, can also be used. In some embodiments, substrate 110 can have additional conductor lines already deposited in cavity 130 to provide additional connectivity for an electrical component to an electrical circuit.

Figure 1B:
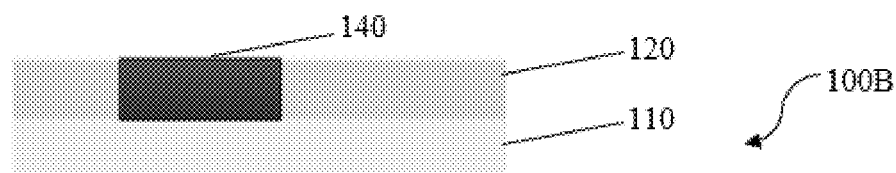

FIG. 1B depicts assembly 100B further including integrated circuit (IC) 140. IC 140 is deposited in cavity 130. Viewed from another perspective, cavity 130 has minimum dimensions such that IC 140 can fit into cavity 130, with the top surface of IC 140 substantially flush with dielectric layer 120. Thus, it is contemplated that cavity 130 is slightly larger than the dimensions of IC 140, for example 1 μm or less. In some embodiments, IC 140 is pretreated with a surface catalyst or conductor lines for additional connectivity to electrical circuits.

Figure 1C:
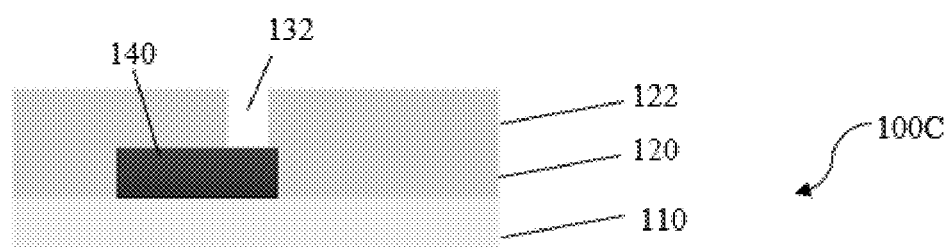

FIG. 1C depicts assembly 100C, which further includes dielectric layer 122 with cavity 132. Dielectric layer 122 is deposited over dielectric layer 120 and IC 140. Cavity 132 is formed by removing a portion of dielectric layer 122 to expose a portion of IC 140, for example the I/O port of IC 140. Dielectric layer 122 is preferably PID, and cavity 132 is formed by photoablation of dielectric layer 122 at the location desired for cavity 132.

Figure 1D:
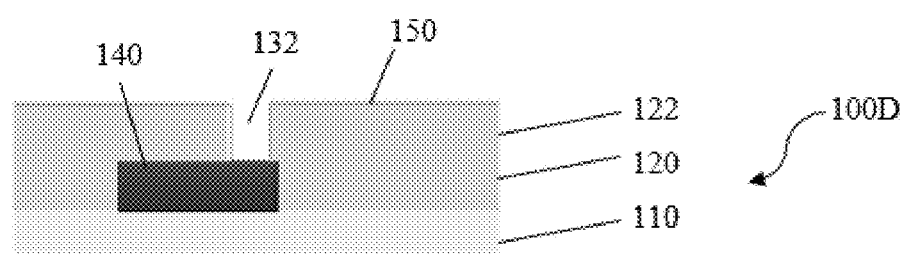

FIG. 1D depicts assembly 100D, which further includes catalyst layer 150, preferably a continuous layer. Catalyst layer 150 is deposited over dielectric layer 122, the walls of cavity 132, and the exposed portion of IC 140, typically no more than 50 nm thick. While catalyst layer typically comprises palladium or platinum, other appropriate materials, alloys, or combinations are contemplated, including for example silver, gold, copper, nickel, cobalt, rhodium, indium, tin, and alloys or combinations thereof.

Figure 1E:
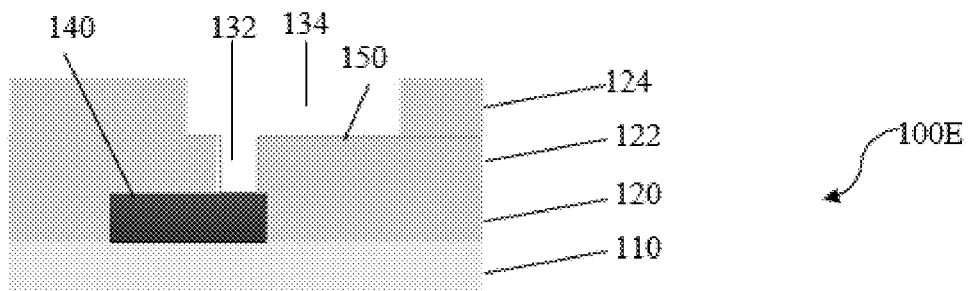

FIG. 1E depicts assembly 100E, which further includes dielectric layer 124 having cavity 134. Dielectric layer 124 is deposited over catalyst layer 150 in a continuous layer. Cavity 134 is formed by removing a portion of dielectric layer 124, preferably via photoablation of a PID, to expose a portion of catalyst 150. The exposed portion of catalyst 150 is in direct contact with a portion of IC 140, and otherwise forms a pattern for a portion of an electrical circuit.

Figure 1F:
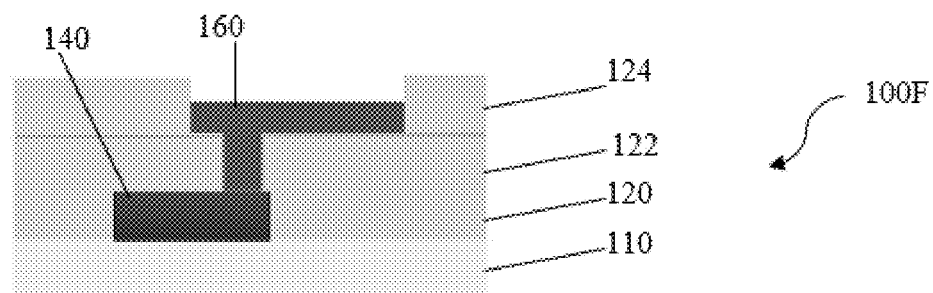

FIG. 1F depicts assembly 100F, which further includes conductor 160 deposited over the exposed portions of catalyst 150, forming the portion of the electrical circuit. It is contemplated that conductor 160 is deposited to catalyst layer 150 via electroless plating, but plating can also be accelerated via electrolytic plating. Conductor 160 is typically copper or an alloy thereof, though additional conductors are also contemplated. As depicted, conductor 160 is in direct contact with IC 140, typically the I/O port of IC 140.

It should be appreciated that the described methods could further be applied to assembly 100F to add a portion of an electrical circuit to assembly 100F. For example, a via whole could be made through substrate 110 to expose additional ports on IC 140. Once exposed, an additional catalyst layer is deposited to the exposed additional port of IC 140, a circuit pattern is created over the catalyst layer, and additional conductor can be plated.

Figure 2A:
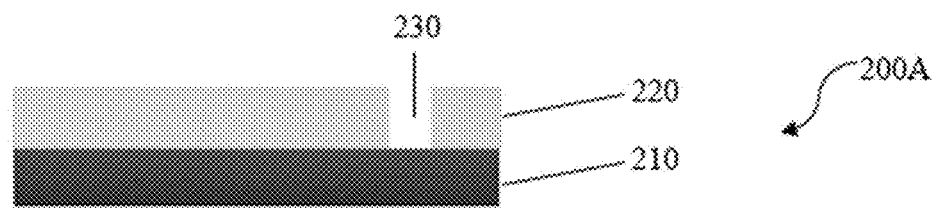
FIGS. 2A-2D depict steps in another process of the inventive subject matter.

FIGS. 2A through 2D depict additional steps for manufacturing a portion of an electrical circuit having an electrical component. FIG. 2A depicts assembly 200A which includes IC 210 and dielectric layer 220. IC 210 can be embedded in dielectric material as previously disclosed, or can free standing. Dielectric layer 220 further includes cavity 230. Cavity 230 is formed by removing a portion of dielectric layer 220, preferably by photoablation of PID. Cavity 230 exposes a portion of IC 210, typically the I/O port of IC 210.

Figure 2B:
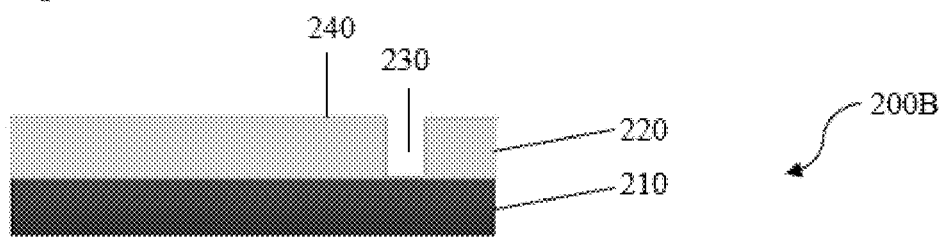

FIG. 2B depicts assembly 200B which further includes catalyst layer 240. Catalyst layer 240 is preferably deposited as a continuous layer of catalyst, such as palladium or platinum, deposited over dielectric layer 220, the walls of cavity 230, and a portion of IC 210 (e.g., I/O port), though additional or alternative catalysts can be used.

Figure 2C:
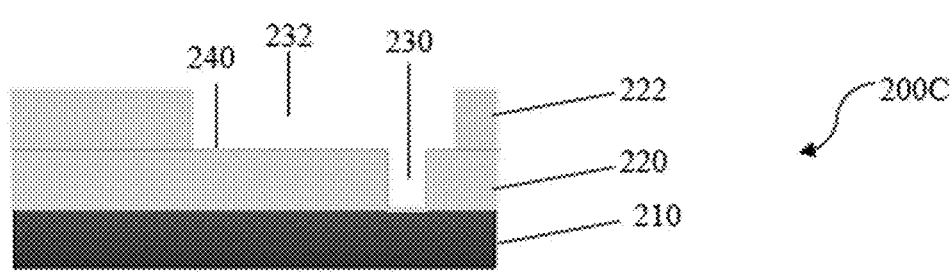

FIG. 2C depicts assembly 200C, which further includes dielectric layer 222 having cavity 232. Dielectric layer is deposited as a continuous layer over catalyst layer 240, and is typically a PID. Cavity 232 is formed by removing a portion of dielectric layer 220 to expose a portion of catalyst 240, preferably by photoablation of PID. The exposed portion of catalyst 240 is typically shaped in the pattern of a designed electrical circuit.

Figure 2D:
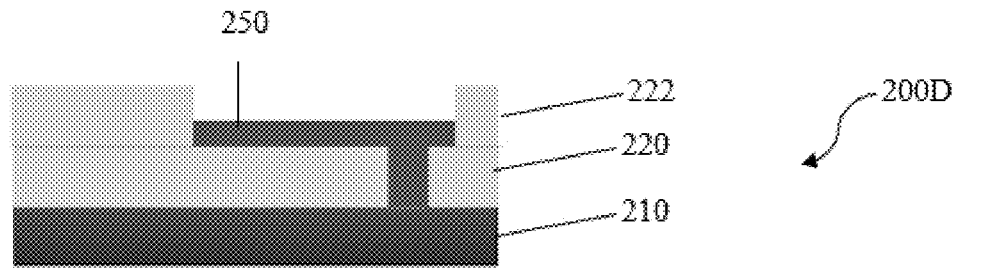

FIG. 2D depicts assembly 200D, which further includes conductor 250 deposited over the exposed portions of catalyst layer 240, forming the conductor portion of the electrical circuit. It is contemplated that conductor 250 is deposited to the exposed portion of catalyst layer 240 via electroless plating, but plating can also be accelerated via electrolytic plating. Conductor 250 is typically copper or an alloy thereof, though additional conductors are also contemplated. As depicted, conductor 250 is in direct contact with IC 210, typically the I/O port of IC 210.

It should be appreciated that the described methods could further be applied to assembly 100F to add a portion of an electrical circuit to assembly 200D. For example, a catalyst could be deposited on the underside of IC 210, a pattern of an electrical circuit can formed on the catalyst, and conductor can be plated.

Figure 3A:
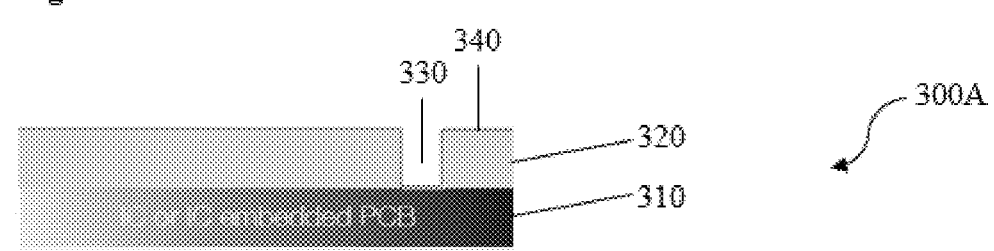
FIGS. 3A-3F depict steps in yet another process of the inventive subject matter.

FIGS. 3A through 3F depict further steps for manufacturing a portion of an electrical circuit having an electrical component. FIG. 3A depicts assembly 300A, which includes IC 310, dielectric layer 320, cavity 330, and catalyst layer 340. IC 310 can be embedded in a dielectric material as previously disclosed, or can be free standing. Assembly 300A can be formed as previously disclosed (e.g., depositing dielectric layer 320 on IC 310, forming cavity 330, and depositing catalyst layer 320 over dielectric layer 320, the walls of cavity 330, and exposed portion of IC 310).

Figure 3B:
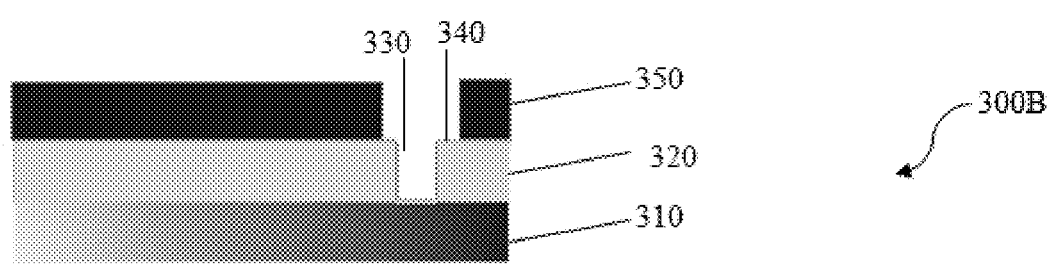

FIG. 3B depicts assembly 300B, which further includes plating resist layer 350. Plating resist layer is deposited over catalyst layer 340 such that a portion of catalyst layer 340 in, and adjacent, to cavity 330 is left exposed.

Figure 3C:
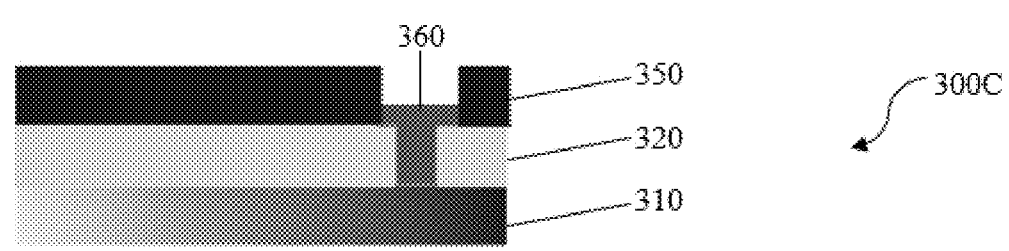

FIG. 3C depicts assembly 300C, which further includes conductor 360 deposited on the exposed portion of catalyst 340, forming a direct contact with IC 310. It is contemplated that conductor 360 is deposited to the exposed portion of catalyst layer 340 via electroless plating, but plating can also be accelerated via electrolytic plating. Conductor 360 is typically copper or an alloy thereof, though additional conductors are also contemplated. As depicted, conductor 360 is in direct contact with IC 310, typically the I/O port of IC 310.

Figure 3D:
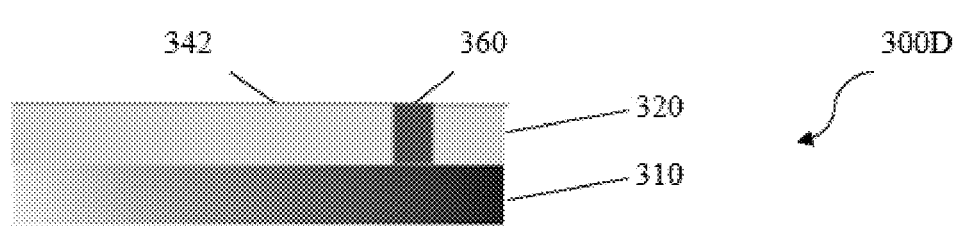

FIG. 3D depicts assembly 300D, where plating resist layer 350 has been removed and a portion of conductor 360 has been removed. Plating resist layer 350 and conductor 360 are removed by mechanically grinding, such that the top surface of conductor 360 is substantially flush with dielectric layer 320. Catalyst layer 342 is further deposited over dielectric layer 320 and conductor 360.

Figure 3E:
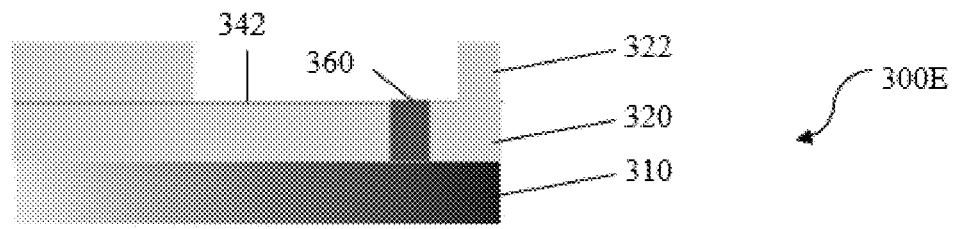

FIG. 3E depicts assembly 300E, which further includes dielectric layer 322 and cavity 370. Dielectric layer 322 is deposited over catalyst layer 342, and a portion of dielectric layer 322 is removed to expose a portion of catalyst layer 342 in the pattern of a portion of an electrical circuit. Cavity 342 is formed by removing a portion of dielectric layer 322, typically by photoablation of PID.

Figure 3F:
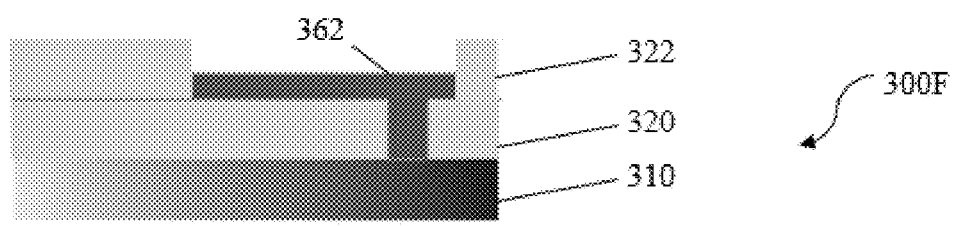

FIG. 3F depicts assembly 300F, which further includes conductor 362 deposited to catalyst layer 342, forming a portion of an electrical circuit. It is contemplated that conductor 360 is deposited to the exposed portion of catalyst layer 342 via electroless plating, but plating can also be accelerated via electrolytic plating. Conductor 360 is typically copper or an alloy thereof, though additional conductors are also contemplated. As depicted, conductors 360 and 362 constitute a circuit in direct contact with IC 310, typically the I/O port of IC 310.

Figure 4A:
FIGS. 4A-4F depict steps in still another process of the inventive subject matter.

FIGS. 4A through 4F depicts additional methods for manufacturing a portion of an electrical circuit having an electrical component. FIG. 4A depicts assembly 400A, which includes IC 410 and catalyst layer 420. It is contemplated that IC can be embedded in a dielectric layer as previously disclosed or free standing. Catalyst layer 420 is preferably continuous, and comprises catalysts as previously described.

Figure 4B:
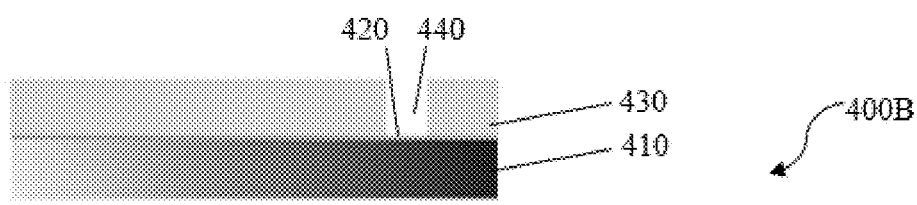

FIG. 4B depicts assembly 400B, which further includes dielectric layer 430 and cavity 440. Assembly 400 B is formed as previously disclosed (e.g., depositing dielectric layer 430 on IC 410, forming cavity 440, for example via photoablation of PID). Cavity 440 exposes a portion of catalyst layer 420 over a portion of IC 410, preferably the I/O port.

Figure 4C:
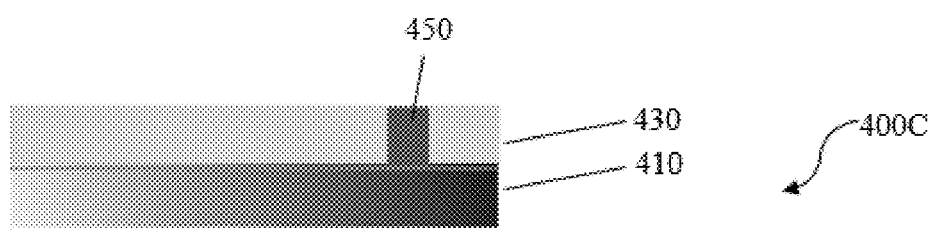

FIG. 4C depicts assembly 400C, which further includes conductor 450 deposited to an exposed portion of catalyst layer 420, forming a direct contact with IC 410. It is contemplated that conductor 450 is deposited to the exposed portion of catalyst layer 420 via electroless plating, but plating can also be accelerated via electrolytic plating. Conductor 450 is typically copper or an alloy thereof, though additional conductors are also contemplated. As depicted, conductor 450 is in direct contact with IC 410, typically the I/O port of IC 410.

Figure 4D:
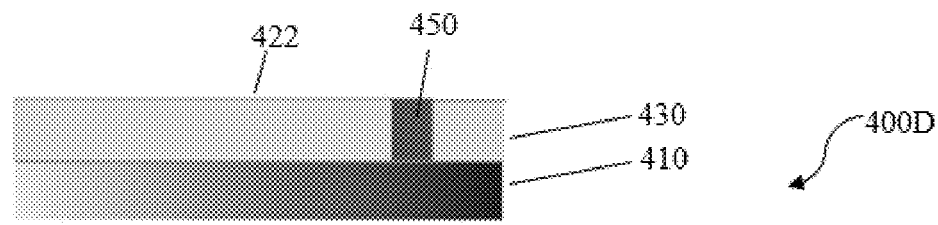

FIG. 4D depicts assembly 400D, which further includes catalyst layer 422 deposited over dielectric layer 430 and conductor 450. Catalyst layer 422 is preferably a continuous layer of catalyst as previously described.

Figure 4E:
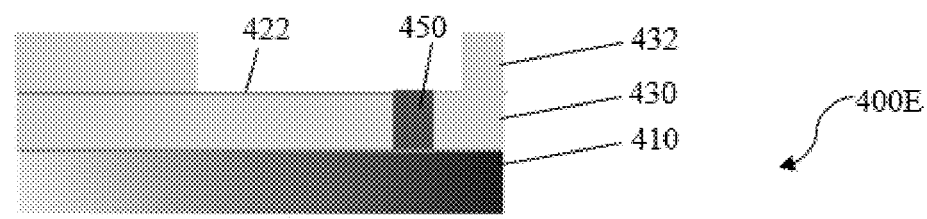

FIG. 4E depicts assembly 400E, which further includes dielectric layer 432 and cavity 442. Dielectric layer 432 is deposited over catalyst layer 422, and a portion of dielectric layer 432 is removed to expose a portion of catalyst layer 422 in the pattern of a portion of an electrical circuit. Cavity 442 is formed by removing a portion of dielectric layer 432, typically by photoablation of PID.

Figure 4F:
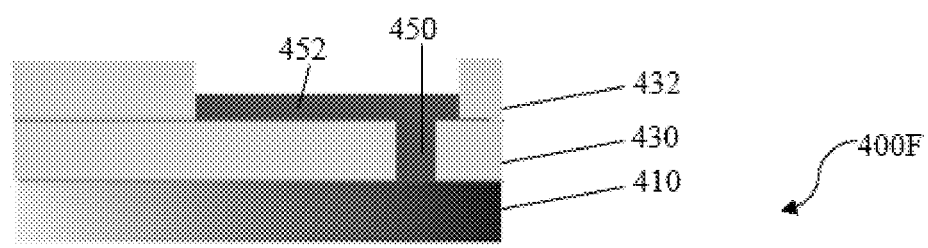

FIG. 4F depicts assembly 400F, which further includes conductor 452, forming a portion of an electrical circuit. It is contemplated that conductor 4520 is deposited to the exposed portion of catalyst layer 422 via electroless plating, but plating can also be accelerated via electrolytic plating. Conductor 452 is typically copper or an alloy thereof, though additional conductors are also contemplated. As depicted, conductors 450 and 452 constitute a circuit in direct contact with IC 410, typically the I/O port of IC 410.

Figure 5:
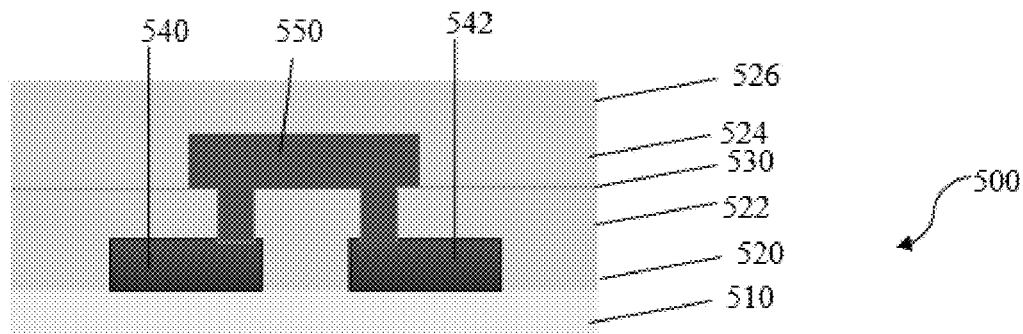
FIG. 5 depicts a portion of a circuit of the inventive subject matter.

It should be appreciated that the methods for manufacturing a portion of an electrical circuit as described herein can be used to manufacture portions of electrical circuits comprising multiple electrical components, for example two ICs. FIG. 5 depicts a portion of assembly 500 having ICs 540 and 542 on substrate 510, and embedded in dielectric layers 520 522, with portions of ICs 540 and 542 connected via conductor 550, preferably the I/O ports of ICs 540 and 542. In this embodiment, ICs 540 and 542 are located in dielectric layer 520, with dielectric layers 524 and 526 encasing conductor 550.

Figure 6:
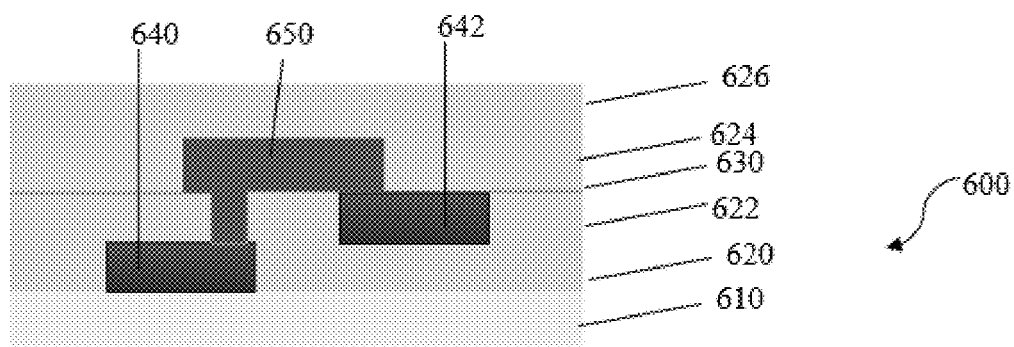
FIG. 6 depicts a portion of another circuit of the inventive subject matter.

FIG. 6 depicts an additional portion of electrical circuit that can be manufactured using the methods disclosed herein. Assembly 600 has ICs 640 and 642, with IC 640 on substrate 610 in dielectric layer 620, and IC 642 in dielectric layer in 622. Portions of ICs 640 and 642 are connected via conductor 650, preferably the I/O ports of ICs 640 and 642. In this embodiment, ICs 640 and 642 are located in two adjacent dielectric layers, 620 and 622, with dielectric layers 624 and 626 encasing conductor 650.

Figure 7:
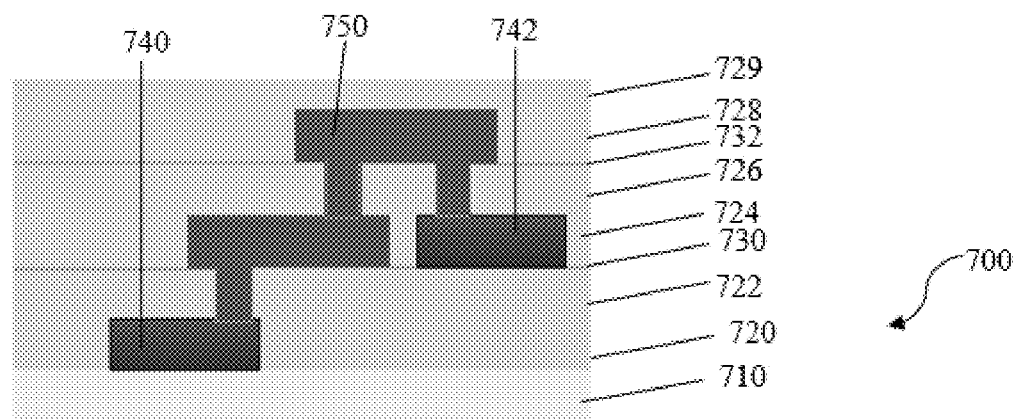
FIG. 7 depicts a portion of yet another circuit of the inventive subject matter.

FIG. 7 depicts an additional portion of electrical circuit that can be manufactured using the methods disclosed herein. Assembly 700 has ICs 740 and 742, with IC 740 on substrate 710 in dielectric layer 720, and IC 742 in dielectric layer in 724. Portions of ICs 740 and 742 are connected via conductor 750, preferably the I/O ports of ICs 740 and 742. In this embodiment, ICs 740 and 742 are located in two non-adjacent dielectric layers, 670 and 724, with dielectric layers 722, 726, 728, and 729 encasing conductor 750.

Figure 8A:
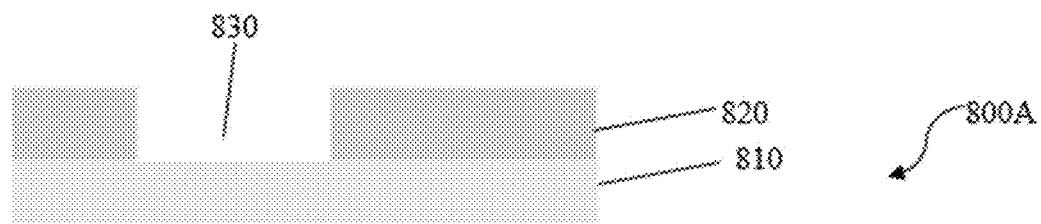
FIGS. 8A-8E depict steps in another process of the inventive subject matter.

FIGS. 8A through 8E disclose additional methods for manufacturing portions of electrical circuits having electrical components. FIG. 8A depicts assembly 800A, which has substrate 810, dielectric layer 820, and cavity 830. Cavity 830 is formed as described herein, for example via photoablation of a portion of (PID) dielectric layer 820.

Figure 8B:
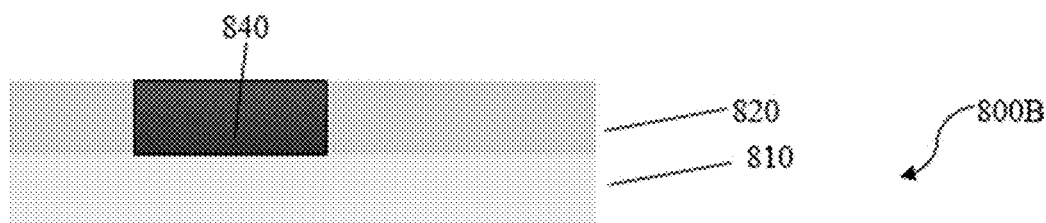

FIG. 8B depicts assembly 800B, which further has IC 840. IC 840 is deposited in cavity 830, has at least the same dimensions as IC 840, though there may be gaps between the edges of IC 840 and cavity 830.

Figure 8C:
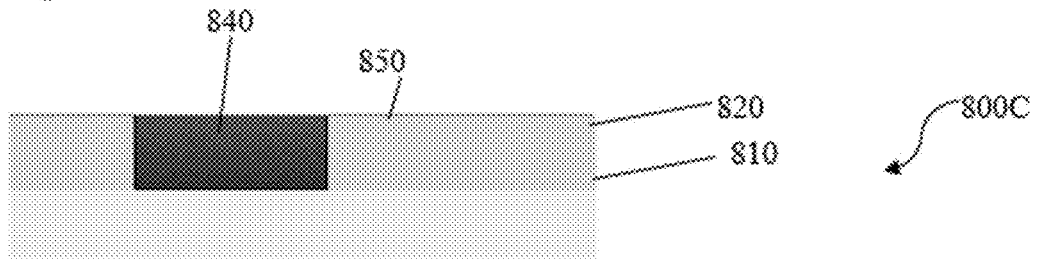

FIG. 8C depicts assembly 800C, which further includes catalyst layer 850 deposited on dielectric layer 820 and IC 840. Preferably, catalyst layer 850 is a continuous layer of catalyst as disclosed herein.

Figure 8D:
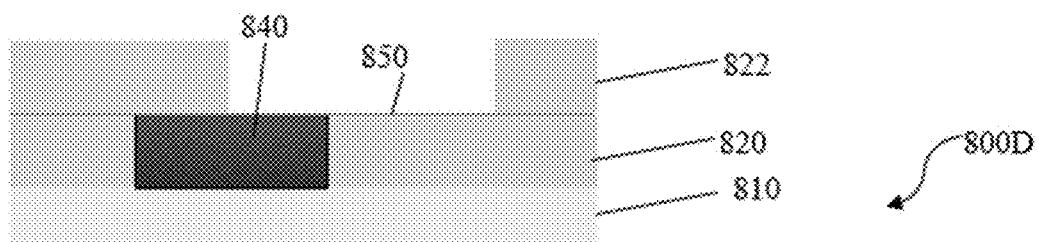

FIG. 8D depicts assembly 800D, which further includes dielectric layer 822 and cavity 832. Dielectric layer 822 is deposited over catalyst layer 850 in a continuous layer. Cavity 832 is formed by removing a portion of dielectric layer 822, preferably via photoablation of PID, to expose a portion of catalyst 850. The exposed portion of catalyst 850 is in direct contact with a portion of IC 840, preferably an I/O port, and otherwise forms a pattern for a portion of an electrical circuit.

Figure 8E:
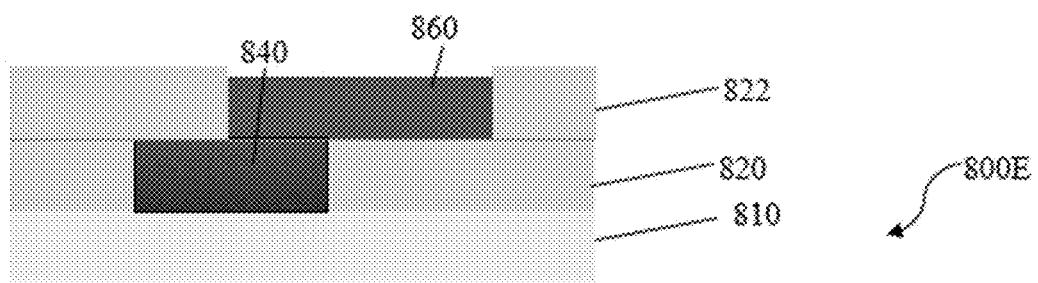

FIG. 8E depicts assembly 800E, which further includes conductor 860 deposited to catalyst layer 850, forming a portion of an electrical circuit. It is contemplated that conductor 860 is deposited to the exposed portion of catalyst layer 850 via electroless plating, but plating can also or alternatively be accelerated via electrolytic plating. Conductor 860 is typically copper or an alloy thereof, though additional conductors are also contemplated. As depicted, conductor 860 is in direct contact with IC 840, typically the I/O port of IC 840.

This discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

Unless the context dictates the contrary, all ranges set forth herein should be interpreted as being inclusive of their endpoints, and open-ended ranges should be interpreted to include only commercially practical values. Similarly, all lists of values should be considered as inclusive of intermediate values unless the context indicates the contrary.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A method for manufacturing a portion of a circuit, comprising:
    depositing a first catalyst onto and in direct contact with a portion of an integrated circuit (IC), wherein the portion of the IC is an input/output (I/O) port;
    forming a first layer of dielectric material onto and in direct contact with a portion of the first catalyst, wherein the first layer of dielectric material covers the first catalyst, the IC, and the I/O port;
    forming an exposed portion of the first catalyst and depositing a first conductor over the exposed portion of the first catalyst;
    depositing a second catalyst over the first layer of dielectric material, wherein a portion of the second catalyst contacts the first conductor; and
    depositing a second conductor over an exposed portion of the second catalyst.

2. The method of claim 1, wherein the step of forming the exposed portion of the first catalyst comprises removing a portion of the first layer of dielectric material to form the exposed portion of the first catalyst, wherein the exposed portion of the first catalyst is in direct contact with the IC.

3. The method of claim 1, further comprising:
    depositing a second layer of dielectric material onto and at least partially in direct contact with the second catalyst; and
    removing a portion of the second layer of the dielectric material to form the exposed portion of the second catalyst.

4. The method of claim 3, wherein the step of depositing the second conductor embeds the IC within the second conductor and the second layer of dielectric material.

5. The method of claim 1, comprising forming the exposed portion of the first catalyst after forming the first layer of dielectric material.

6. The method of claim 1, wherein the first conductor is in direct contact with a portion of the first catalyst in direct contact with the I/O port of the IC.

7. The method of claim 1, wherein the step of forming the first layer of dielectric material over the first catalyst embeds the IC within the first layer of dielectric material.

8. The method of claim 1, wherein the step of depositing the first catalyst embeds the IC within the first catalyst.

9. The method of claim 1, wherein the steps of depositing the first conductor and depositing the first layer of the first layer of dielectric material embed the IC within dielectric material and the first conductor.

10. The method of claim 1, wherein the step of depositing the second catalyst embeds the IC within the second catalyst.

11. The method of claim 1, wherein direct contact of the second conductor with the first conductor and direct contact of the first conductor and the I/O port of the IC comprises the portion of the circuit.

* * * * *